United States Patent
Ju et al.

(10) Patent No.: US 8,022,791 B2
(45) Date of Patent: Sep. 20, 2011

(54) RADIO FREQUENCY DEVICE COMPRISING A VIBRATILE CARBON NANOTUBE AND A VIBRATILE TUNING ELECTRODE

(75) Inventors: Chull Won Ju, Daejeon (KR); Jonghyurk Park, Daegu (KR); Yong Il Jun, Daejeon (KR); Hee-Bum Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 301 days.

(21) Appl. No.: 12/495,579

(22) Filed: Jun. 30, 2009

(65) Prior Publication Data

US 2010/0134208 A1 Jun. 3, 2010

(30) Foreign Application Priority Data

Dec. 3, 2008 (KR) .................. 10-2008-0121800
Mar. 26, 2009 (KR) .................. 10-2009-0025678

(51) Int. Cl.
*H03H 9/24* (2006.01)
*H03H 9/46* (2006.01)
*H04B 1/16* (2006.01)

(52) U.S. Cl. ........ 333/186; 333/200; 977/732; 977/742; 977/932; 977/949; 455/334; 455/335

(58) Field of Classification Search .................. 333/186, 333/200; 977/732, 734, 742, 750, 752, 932, 977/939, 949; 455/334, 335, 337, 341

See application file for complete search history.

(56) References Cited

U.S. PATENT DOCUMENTS 6,737,939 B2 * 5/2004 Hoppe et al. .................. 333/186
6,803,840 B2 * 10/2004 Hunt et al. .................... 333/186
7,106,124 B2 9/2006 Zoulkarneev et al.
2006/0197076 A1 * 9/2006 Adam .............................. 257/25
2007/0176832 A1 8/2007 Qian et al.
2010/0144296 A1 * 6/2010 Burke et al. .................. 455/205

FOREIGN PATENT DOCUMENTS

KR 10-0877624 1/2009

OTHER PUBLICATIONS

M. Dragoman et al.; "The Carbon Nanotube Radio"; 2008 International Semiconductor Conference, CAS 2008, vol. 1, pp. 77-80, Oct. 13-15, 2008.*
IEEE Xplore-Abstract page for M. Dragoman et al.; "The Carbon Nanotube Radio", issue date Oct. 13-15, 2008.*
K. Jensen et al., "Nanotube Radio", Nano Letters, 2007 vol. 7, No. 11, pp. 3508-3511, published on Web Oct. 31, 2007.

* cited by examiner

*Primary Examiner* — Barbara Summons
(74) *Attorney, Agent, or Firm* — Rabin & Berdo, P.C.

(57) ABSTRACT

An RF device is provided. The RF device includes a vibratile carbon nanotube having a nanotube natural frequency (f0), a negative electrode fixed to a first end of the carbon nanotube, a vibratile tuning electrode having a variable resonance frequency and facing a second end of the carbon nanotube, and a positive electrode electrically connected to a first end of the tuning electrode. A second end of the tuning electrode is adjacent to the second end of the carbon nanotube, and the carbon nanotube vibrates at a carrier frequency according to an external electromagnetic wave having the carrier frequency, and the tuning electrode having variable resonance frequency characteristics amplifies distance variation between the second end of the carbon nanotube and the second end of the tuning electrode to increase an electron emission sensitivity according to field emission.

11 Claims, 7 Drawing Sheets

RADIO FREQUENCY DEVICE COMPRISING A VIBRATILE CARBON NANOTUBE AND A VIBRATILE TUNING ELECTRODE

CROSS-REFERENCE TO RELATED APPLICATIONS

This U.S. non-provisional patent application claims priority under 35 U.S.C. §119 of Korean Patent Application Nos. 10-2008-0121800, filed on Dec. 3, 2008, and 10-2009-0025678, filed on Mar. 26, 2009, the entire contents of which are hereby incorporated by reference.

BACKGROUND OF THE INVENTION

The present invention disclosed herein relates to a radio frequency (RF) device, and more particularly, to an RF device including a carbon nanotube.

Typically, an RF receiver includes an antenna, a modulator, a filter, and an amplifier, which limits the size and power of subminiaturized wireless devices. RF applications are widely applied to local area identification devices such as radio-frequency identification (RFID) devices, and wide area detection or communication devices such as mobile communication devices and radars. Such an RF receiver includes discrete RF components such as an antenna, a filter, a demodulator, and an amplifier. Commonly, RF components are respectively formed according to discrete manufacturing methods, and then connected to each other in a single chip through packaging. Alternatively, RF components may be realized by forming various devices directly on the same substrate. In this case, it is difficult to apply the RF components to implanted subminiaturized devices because of their size and power consumption, or to realize sensor nodes applied to wireless sensor network.

To address these limitations, methods of miniaturizing RF components using a micro-electro-mechanical system (MEMS) technology are being extensively developed. For example, small-sized antennas having a cantilever bridge structure or trampoline structure are realized with the MEMS technology, and a plurality of MEMS capacitors can perform a tuning function of a RF device. To obtain a desired frequency variation width of the MEMS capacitors, a high driving voltage is required, and structures having a size of several hundreds micrometers must be precisely controlled.

RFID devices are required to have low power consumption and a subminiature size. Particularly, such RFID devices must be realized on flexible substrates, such as plastic substrates. When antennas are formed using the MEMS technology, the antennas are susceptible to deformation, and integration circuits such as amplifiers are difficult to realize through an identical chip process. Recently, a printable technology such as an inkjet printing or roll-to-roll process is rising as a core technology for manufacturing RFID devices. It is necessary to link technologies of manufacturing RFID devices to printable process technologies. Thus, there is required an RF receiver including a micro antenna, which achieves subminiaturization, low power consumption, and high sensitivity more easily.

Such an RF receiver including an RFID device can be applied to overall future fusion technology devices such as implanted micro devices, or sensor nodes for wireless sensor network.

SUMMARY OF THE INVENTION

The present invention provides an RF device, which achieves miniaturization, low power consumption, and high sensitivity by using an electrical signal generated according to an external RF signal.

Embodiments of the present invention provide radio frequency devices including: a vibratile carbon nanotube having a nanotube natural frequency (f0); a negative electrode fixed to a first end of the carbon nanotube; a vibratile tuning electrode facing a second end of the carbon nanotube; and a positive electrode electrically connected to a first end of the tuning electrode, wherein a second end of the tuning electrode is adjacent to the second end of the carbon nanotube, and the carbon nanotube vibrates at a carrier frequency according to an external electromagnetic wave having the carrier frequency, and the tuning electrode amplifies an electron emission sensitivity between the second end of the carbon nanotube and the second end of the tuning electrode under a bias between two electrodes.

In some embodiments, the tuning electrode may vibrate at a tuning natural frequency (f1).

In other embodiments, the radio frequency devices may further include a control electrode disposed around the tuning electrode, and the control electrode may apply an electric field between the tuning electrode and the control electrode to change the tuning natural frequency (f1).

In still other embodiments, the electric field may be applied in DC, AC or pulse form between the control electrode and the tuning electrode.

In even other embodiments, an alternating current having the tuning natural frequency (f1) may be applied to the control electrode to increase an amplitude of the tuning electrode.

In yet other embodiments, the tuning electrode may have a cylindrical container shape or a cylindrical rod shape.

In further embodiments, the carbon nanotube may have a single-wall structure or a multi-wall structure.

In still further embodiments, the carbon nanotube may be less than the tuning electrode in diameter.

In even further embodiments, the tuning natural frequency of the tuning electrode may range from about 50 MHz to about 500 MHz.

In yet further embodiments, the tuning electrode may include a shell tuning electrode and an inner dielectric, and the shell tuning electrode may be disposed on an outer surface of the inner dielectric.

In much further embodiments, a pulse or modulating bias voltage may be applied in addition to a DC bias between the negative electrode and the positive electrode.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Carbon nanotubes (CNTs) may have excellent field emission effect. Since such a CNT has a geometric structure, it functions as an oscillator having a nanotube natural frequency f0. The CNT, having a fixed end, may be vibrated by an external electromagnetic wave vibrating at a carrier frequency f. In this case, the CNT may be vibrated at the carrier frequency f by an external force. When the nanotube natural frequency f0 is equal to the carrier frequency f to cause resonance, the amplitude of the CNT may be very large. However, when the nanotube natural frequency f0 is not equal to the carrier frequency f, the amplitude of the CNT may be small. As a result, the CNT's physical properties, e.g., its length needs to be adjusted according to the carrier frequency f. However, since it is difficult to arbitrarily adjust the CNT's physical properties, its frequency tuning range for an RF device is limited.

An RF device according to an embodiment of the present invention may include a CNT and a tuning electrode facing the CNT. The tuning electrode, vibrating at a tuning natural frequency f1, may collect electrons emitted from the CNT. The tuning natural frequency f1 of the tuning electrode may vary according to an electric field between a control electrode and the tuning electrode. A field emission current of the CNT having the nanotube natural frequency f0 may depend on the distance between the tuning electrode and the CNT. As the tuning electrode vibrates at the tuning natural frequency f1, the distance between the tuning electrode and the CNT may be increased. Accordingly, even when the amplitude of the CNT is small, the field emission current of the CNT may have a high sensitivity, like the sensitivity in resonance.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
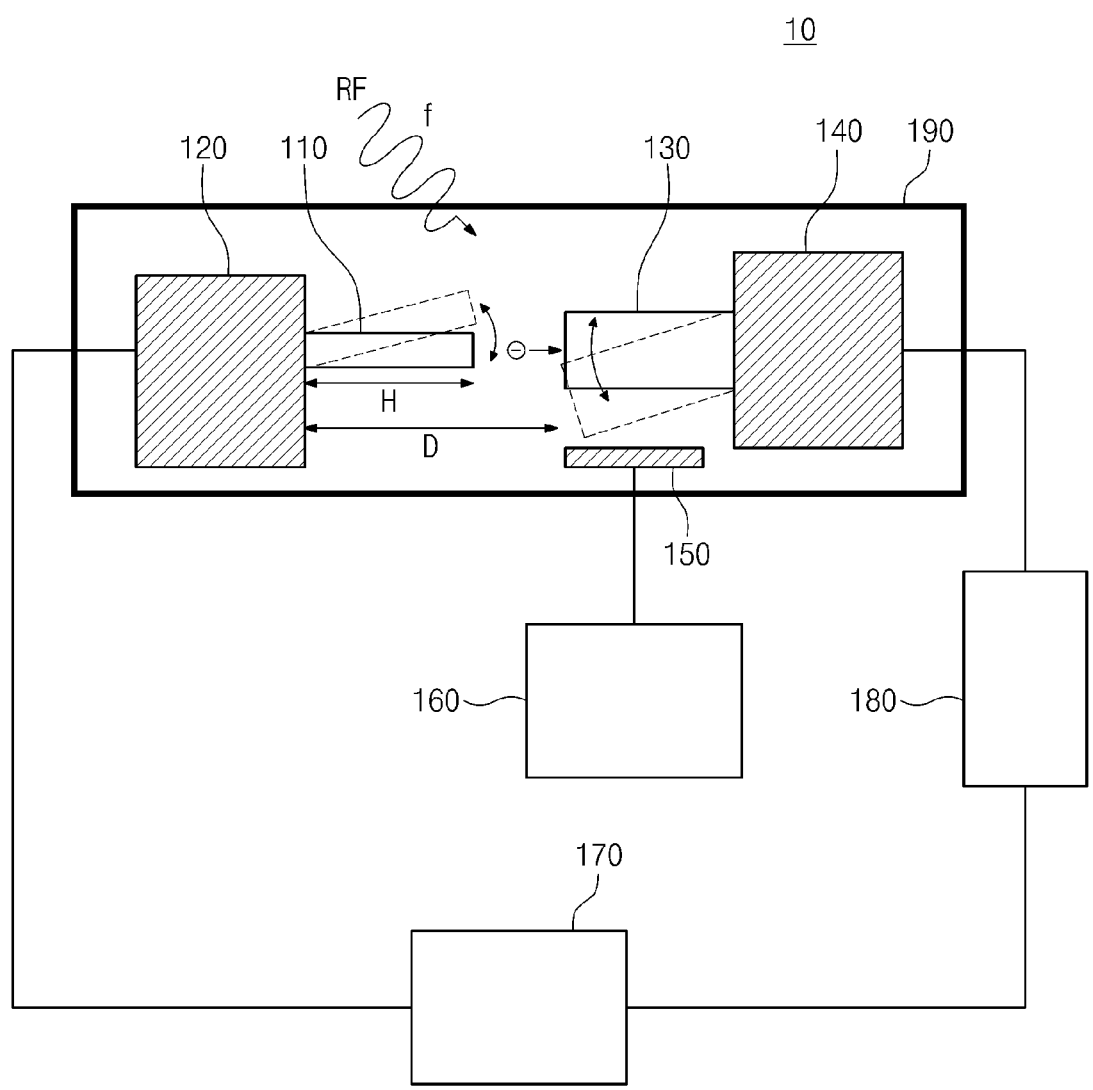
FIG. 1 is a schematic view illustrating a RF device according to an embodiment of the present invention.

FIG. 1 is a schematic view illustrating a RF device 10 according to an embodiment of the present invention.

Referring to FIG. 1, the RF device 10 may include a vibratile carbon nanotube 110 having the nanotube natural frequency f0, a negative electrode 120 fixed to a first end of the carbon nanotube 110, a vibratile tuning electrode 130 facing a second end of the carbon nanotube 110, and a positive electrode 140 fixed to a first end of the tuning electrode 130. A second end of the tuning electrode 130 may closely face the second end of the carbon nanotube 110. According to an external RF electromagnetic wave having the carrier frequency f, the carbon nanotube 110 may vibrate at the carrier frequency f. The tuning electrode 130 may amplify the distance variation between the second end of the carbon nanotube 110 and the second end of the tuning electrode 130 to increase an electron emission sensitivity. The tuning electrode 130 may vibrate at the tuning natural frequency f1.

The carbon nanotube 110 has a field emission current I that may be expressed as Equation (1).

$$I = c_1 A (\lambda E)^2 \exp\left(-\frac{c_2}{\lambda E}\right) \quad (1)$$

where A is an electron-emitting area of the carbon nanotube 110, and E is an electric field applied from the outside, and X is a local field enhancement factor, and $C_1$ and $C_2$ are constants.

λ may be expressed as Equation (2).

$$\lambda = \frac{D}{D-h} + \left\{1 + \sqrt{\frac{h}{\alpha r}}\right\} \quad (2)$$

where D is the distance between the first end of the carbon nanotube 110 the second end of the tuning electrode 130, and h is the length of the carbon nanotube 110, and r is the radius of the carbon nanotube 110, and α is a constant. D(t) is a function of time since the carbon nanotube 110 and the tuning electrode 130 vibrate.

Thus, when the carbon nanotube 110 and/or the tuning electrode 130 vibrate, λ varies with time. λ may be expresses as Equation (3)

$$\lambda = \lambda_0 + \Delta\lambda(t) \quad (3)$$

Except for a zeroth term and a first term of the field emission current I that vary in proportion to the external RF electromagnetic wave having the carrier frequency f, a response Δ I of the field emission current I with time may be a quadratic response expressed as $\Delta I \sim (\Delta\lambda(t))^2$. Quadratic demodulators are widely used for RF filters. That is, the RF device 10 may output a signal demodulated from the external RF electromagnetic wave that is frequency-modulated (FM) or amplitude-modulated (AM) with the carrier frequency f. As the amplitude of the tuning electrode 130 is increased, Δ λ is increased, which increases the sensitivity of the RF device 10.

In the case where the tuning electrode 130 is omitted, when the carrier frequency f is equal to the nanotube natural frequency f0 to cause resonance, the amplitude of the carbon nanotube 110 is maximized. When the carrier frequency f is very different from the nanotube natural frequency f0, the sensitivity of the RF device 10 is significantly reduced. However, the RF device 10 includes the tuning electrode 130 that vibrates at the tuning natural frequency f1 with a predetermined amplitude. As the distance variation between the carbon nanotube 110 and the tuning electrode 130 by adjusting frequency is increased, the sensitivity of the RF device 10, which is expressed as signal variation in the field emission current I in proportion to the distance variation, is increased.

A control electrode 150 applies an electric field to the tuning electrode 130 to control the tuning natural frequency f1 of the tuning electrode 130. When the vibration of the tuning electrode 130 is applied to a harmonic oscillator, an elastic modulus k determining the tuning natural frequency f1 may correspond to the slope of a restoring force in proportion to displacement. When the control electrode 150 applies the electric field between the tuning electrode 130 and the control electrode 150, a force is applied to an electric charge induced to the tuning electrode 130 in the manner of a restoring force in proportion to displacement. Thus, the tuning natural frequency f1 of the tuning electrode 130 is adjusted according to a voltage applied to the control electrode 150 in the manner of varying the elastic modulus k of the harmonic oscillator. The tuning natural frequency f1 of the tuning electrode 130 may range from about 50 MHz through about 500 MHz.

For example, when the carbon nanotube 110 has a length of about 1 μm and a diameter of about 10 nm, the nanotube natural frequency f0 is about 100 MHz. The tuning electrode 130 may include metal having a high electric conductivity. When the tuning electrode 130, which is cylindrical, may have an outer radius $r_o$ of about 100 nm, an inner radius $r_i$ of about 90 nm, a thickness of about 10 nm, and a length L of about 1 μm, the tuning natural frequency f1 may be expressed as Equation (4)

$$f = \frac{0.56}{L^2}\sqrt{\frac{YI}{\rho A}} \quad (4)$$

where Y is Young's modulus, and ρ is density, and $I=\pi/4(r_o^4-r_i^4)$, and $A=\pi(r_o^2-r_i^2)$. When $r_o$=100 nm and $r_o-r_i$=10 nm, L=1 μm, and ρ=4 g/cm$^3$, the tuning natural frequency f1 may be about 100 MHz. Thus, the tuning electrode 130 controls the tuning natural frequency f1 according to a voltage applied to the control electrode 150 within a typical FM frequency band.

The field emission current I may flow through an outer wall of the tuning electrode 130. The RF electromagnetic wave is modulated with a high frequency carrier wave and transmitted to the carbon nanotube 110. A signal, demodulated through a current variation characteristic according to the vibration of the tuning electrode 130, may be detected separately from the carrier wave. For example, the tuning natural frequency f1 of the tuning electrode 130 may be designed to have a resonance characteristic at a carrier frequency band of the carrier wave.

The resonance characteristic of the carbon nanotube 110 may appear within a lower frequency band than the carrier frequency f of the carrier wave. Thus, the tuning electrode 130 may adjust an available frequency band.

According to another embodiment of the present invention, the tuning electrode 130 is vibrated at the tuning natural frequency f1 with an alternating current power having the same frequency as the tuning natural frequency f1, which causes resonance to maximize the amplitude of the tuning electrode 130.

A first power unit 170 may apply a DC voltage between the negative electrode 120 and the positive electrode 140. The nanotube natural frequency f0 of the carbon nanotube 110 may be precisely changed according to the DC voltage.

The positive electrode 140 may be connected to ground. A current detector 180 may measure the field emission current I flowing between the negative electrode 120 and the positive electrode 140.

A second power unit 160 may be connected to the control electrode 150. The second power unit 160 may supply a DC power or AC power. A DC voltage may be applied to the control electrode 150 in pulse form. A frequency f2 of the AC power may be equal to the tuning natural frequency f1 of the tuning electrode 130 and be varied.

The RF device 10 may be disposed in a vacuum container 190 that may have a pressure of about 0.1 mTorr or less.

Figure 2:
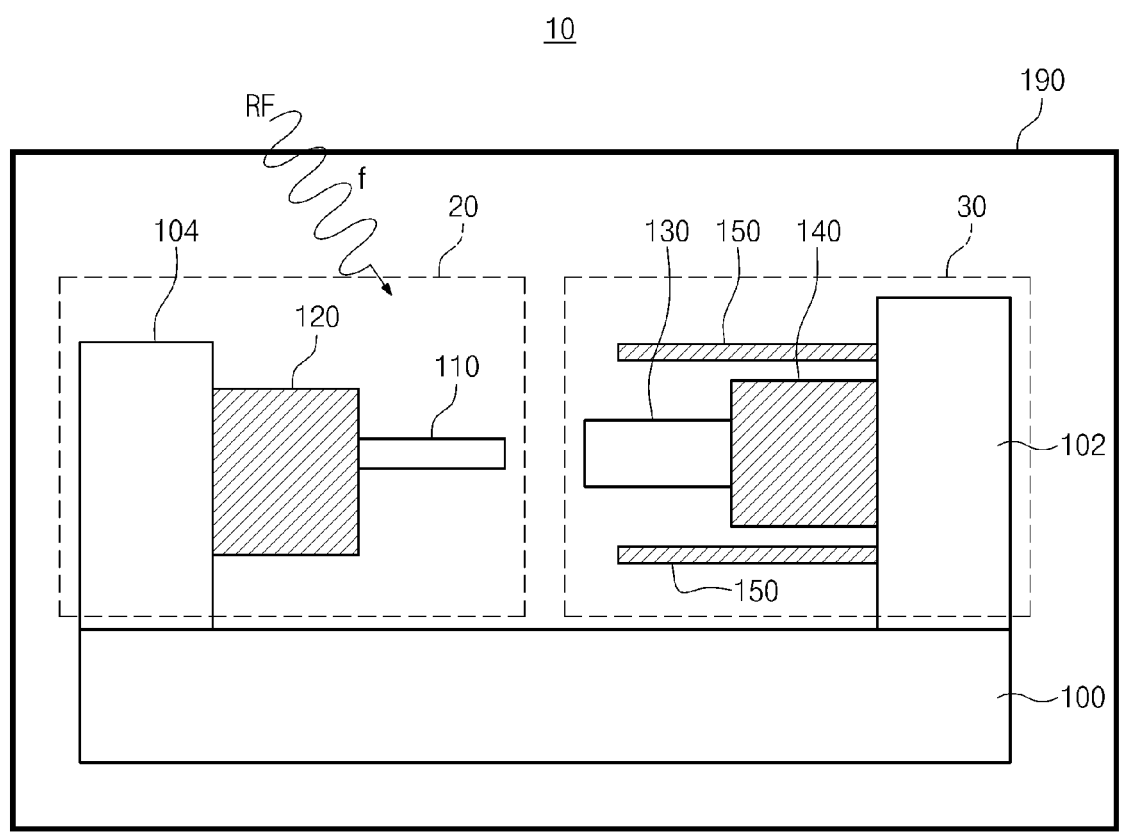
FIG. 2 is a schematic view illustrating a RF device according to another embodiment of the present invention.

FIG. 2 is a schematic view illustrating the RF device 10 according to another embodiment of the present invention.

Referring to FIG. 2, the RF device 10 may include the vibratile carbon nanotube 110 having the nanotube natural frequency f0, the negative electrode 120 fixed to the first end of the carbon nanotube 110, the vibratile tuning electrode 130 facing the second end of the carbon nanotube 110, and the positive electrode 140 fixed to the first end of the tuning electrode 130. The second end of the tuning electrode 130 may closely face the second end of the carbon nanotube 110. According to the external RF electromagnetic wave having the carrier frequency f, the carbon nanotube 110 may vibrate at the carrier frequency f. The tuning electrode 130 may amplify the distance variation between the second end of the carbon nanotube 110 and the second end of the tuning electrode 130 to increase the electron emission sensitivity. The tuning electrode 130 may vibrate at the tuning natural frequency f1.

A negative electrode structure 20 may include a first substrate 104, the negative electrode 120, and the carbon nanotube 110. The negative electrode 120 may be disposed on the first substrate 104 that may include at least one of a glass substrate, a polymer substrate, and a semiconductor substrate. The carbon nanotube 110 may grow on the negative electrode 120.

The negative electrode 120 may be conductive. The negative electrode 120 may include at least one of aluminum, copper, gold, silver, platinum, titanium, tungsten, molybdenum, and tantalum. The negative electrode 120 may include a catalyst layer (not shown) that may include at least one of cobalt, iron, nickel, and molybdenum. The catalyst layer may be formed only in a predetermined region on the negative electrode 120 by using a lift-off technique, an electron beam lithograph technique, or a minute tip.

The carbon nanotube 110 may be a single-wall carbon nanotube or a multi-wall carbon nanotube. The carbon nanotube 110 may be formed selectively on the catalyst layer with a plasma enhanced chemical vapor deposition (PECVD) method. The length and/or radius of the carbon nanotube 110 may be set such that the carbon nanotube 110 has a frequency close to the carrier frequency f, but are not limited thereto.

A positive electrode structure 30 may include a second substrate 102, the positive electrode 140, the tuning electrode 130, and the control electrode 150. The positive electrode 140 may be disposed on the second substrate 102 that may include at least one of a glass substrate, a polymer substrate, and a semiconductor substrate. The tuning electrode 130 may be disposed on the positive electrode 140. The positive electrode 140 may be conductive. The positive electrode 140 may include at least one of aluminum, copper, gold, silver, platinum, titanium, tungsten, molybdenum, and tantalum. The tuning electrode 130 may be conductive and have a cylindrical container shape or a cylindrical rod shape. The tuning electrode 130 may be greater than the carbon nanotube 110 in diameter. When the tuning electrode 130 is the cylindrical container structure, the tuning electrode 130 may include a shell tuning electrode and an inner dielectric. The shell tuning electrode may be disposed on the outer surface of the inner dielectric.

The control electrode 150 may be disposed around the tuning electrode 130. The control electrode 150 may be disposed on the second substrate 102. The control electrode 150 may be provided in plurality. The control electrodes 150 may be symmetrical with respect to the tuning electrode 130, but are not limited thereto. The control electrode 150 may be conductive. The control electrode 150 may include at least one of doped semiconductor, aluminum, copper, gold, silver, platinum, titanium, tungsten, molybdenum, and tantalum. An upper surface of the control electrode 150 may be lower than an upper surface of the tuning electrode 130.

The positive electrode structure 30 and the negative electrode structure 20 may face each other on a base substrate 100. The carbon nanotube 110 may be aligned with the tuning electrode 130. The positive electrode structure 30 and the negative electrode structure 20 may be fixed to the base substrate 100. That is, the positive electrode structure 30 and the negative electrode structure 20 may be discretely fabricated and mounted on the base substrate 100.

The positive electrode structure 30, the negative electrode structure 20, and the base substrate 100 may be disposed in the vacuum container 190. The vacuum container 190 may include at least one of glass, ceramic, and dielectric. The vacuum container 190 may transmit the RF electromagnetic wave. The vacuum container 190 may have an internal pressure of about 0.1 mTorr or less.

Figure 3A:
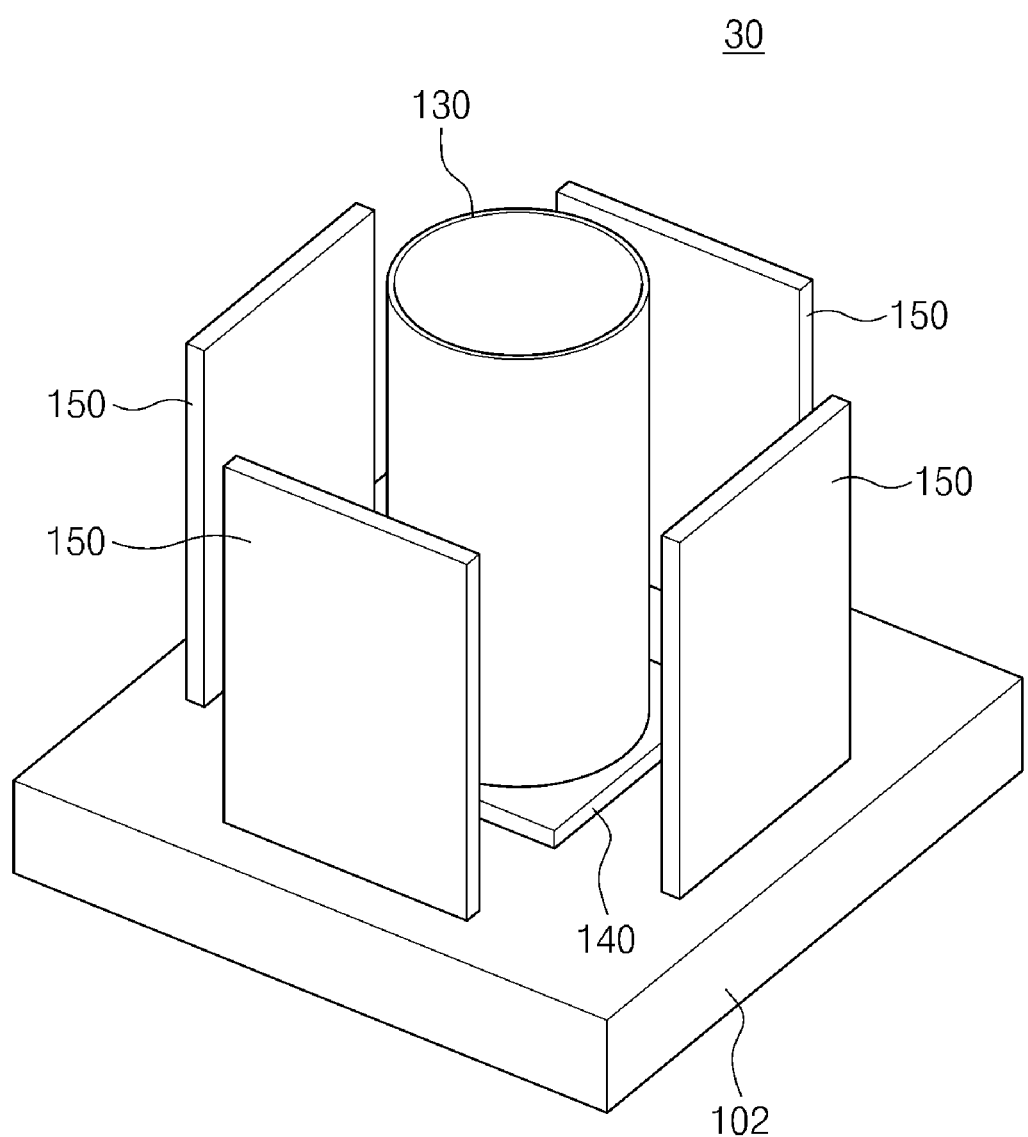
FIGS. 3A through 3C are perspective views illustrating positive electrode structures according to embodiments of the present invention.
Figure 3B:
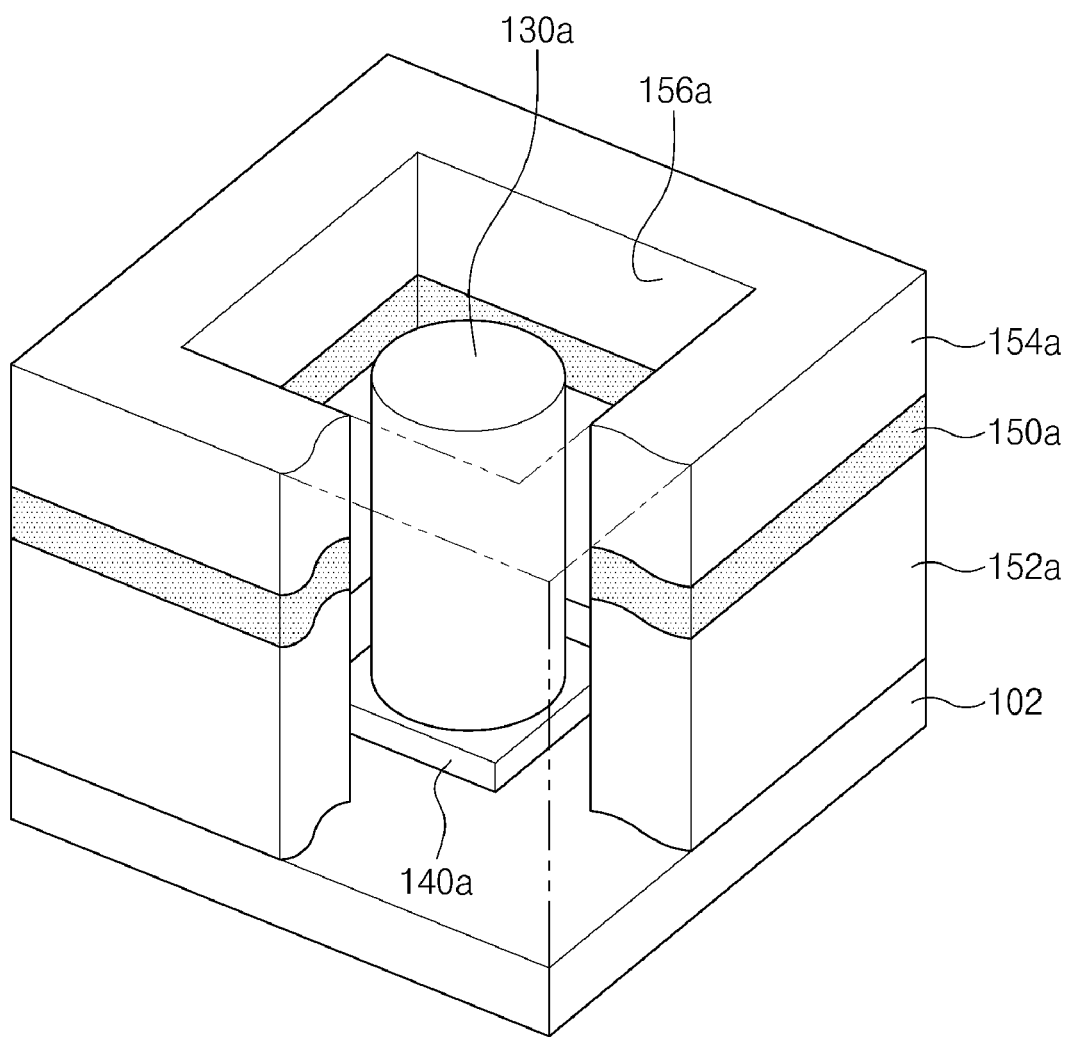
Figure 3C:
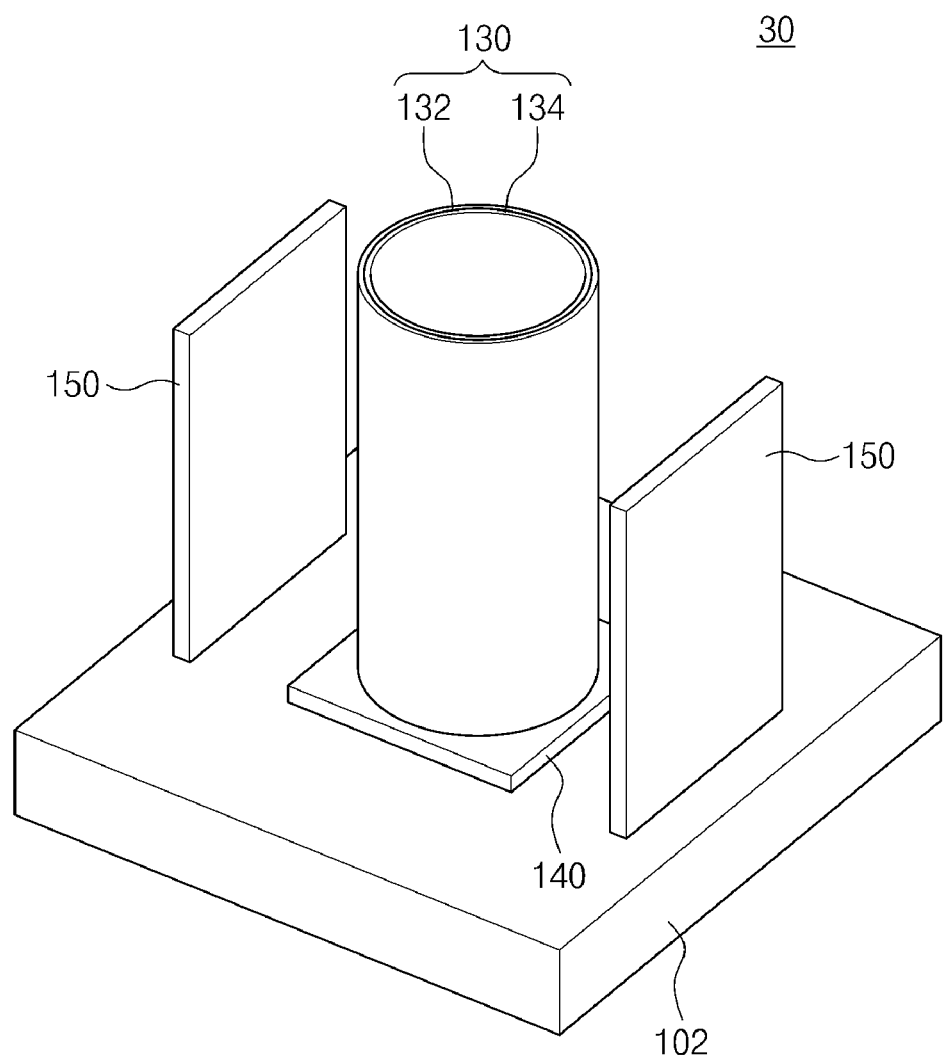

FIGS. 3A through 3C are perspective views illustrating the positive electrode structures 30 according to embodiments of the present invention. The same description as in FIG. 2 will be omitted.

Referring to FIG. 3A, the positive electrode structure 30 may include the second substrate 102, the positive electrode 140, the tuning electrode 130, and the control electrodes 150. The positive electrode 140 may be disposed on the second substrate 102. The tuning electrode 130 may be disposed on the positive electrode 140. The tuning electrode 130 may be a cylindrical container structure. The tuning electrode 130 may be formed using a technology of forming a capacitor of a DRAM. The control electrodes 150 may face each other with the tuning electrodes 130 in the center thereof. The control electrodes 150 may be provided in quadruplicate. The control electrodes 150 may be disposed on the second substrate 102.

Referring to FIG. 3B, the positive electrode structure 30 may include the second substrate 102, a positive electrode 140a, a tuning electrode 130a, and a control electrode 150a. The positive electrode 140a may be disposed on the second substrate 102.

A first interlayer dielectric, a control electrode layer, and a second interlayer dielectric may be disposed on the second substrate 102 with the positive electrode 140a. The second interlayer dielectric, the control electrode layer, and the first interlayer dielectric may be sequentially patterned to form a second interlayer dielectric pattern 154a, the control electrode 150a, a first interlayer dielectric pattern 152a, and a hole 156a. An upper surface of the second substrate 102 may define a lower limit of the hole 156a. The hole 156a may expose the positive electrode 140a. The tuning electrode 130a may be disposed on the exposed positive electrode 14a. The tuning electrode 130a may be cylindrical.

Referring to FIG. 3C, the positive electrode structure 30 may include the second substrate 102, the positive electrode 140, the tuning electrode 130, and the control electrodes 150. The positive electrode 140 may be disposed on the second substrate 102. The tuning electrode 130 may be disposed on the positive electrode 140. The tuning electrode 130 may be a cylindrical container structure. The tuning electrode 130 may include a shell tuning electrode 132 and an inner dielectric 134. The shell tuning electrode 132 may be disposed on the outer surface of the inner dielectric 134. The control electrodes 150 may face each other with the tuning electrode 130 in the center thereof. The control electrodes 150 may be provided in duplicate. The control electrodes 150 may be disposed on the second substrate 102.

Figure 4A:
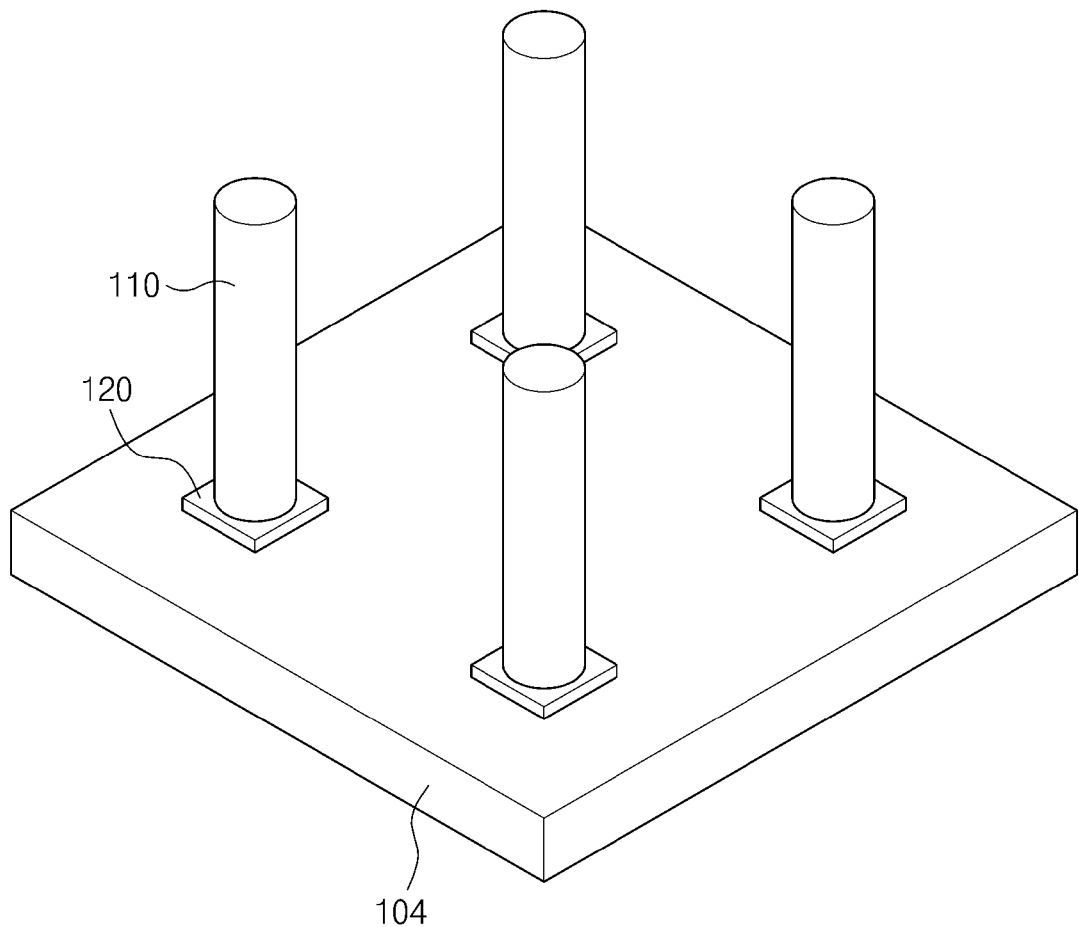
FIGS. 4A and 4B are perspective views illustrating a negative electrode structure and a positive electrode structure constituting a RF device according to embodiments of the present invention.
Figure 4B:
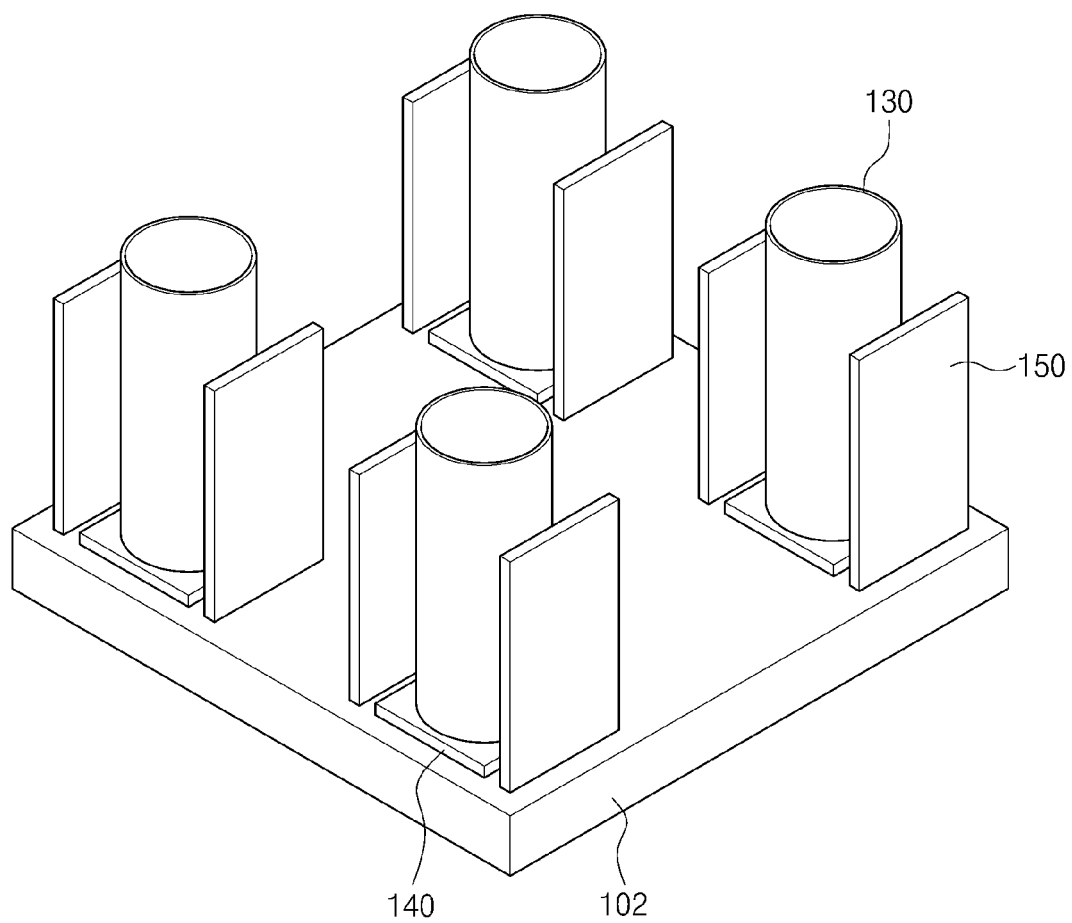

FIGS. 4A and 4B are perspective views illustrating the negative electrode structure 20 and the positive electrode structure 30 constituting a RF device according to embodiments of the present invention. The negative structure 20 of FIG. 4A are coupled to the positive structure 30 of FIG. 4B to constitute the RF device.

Referring to FIG. 4A, the negative electrode 120 may be provided in plurality, and the carbon nanotube 110 may be provided in plurality, and the negative electrode structure 20 may include the first substrate 104, the negative electrodes 120, and the carbon nanotubes 110. The negative electrodes 120 may be regularly arranged in island shape on the first substrate 104. The carbon nanotubes 110 may be disposed on the negative electrodes 120, respectively.

Referring to FIG. 4B, the positive electrode 140 may be provided in plurality, and the tuning electrode 130 may be provided in plurality, and the positive electrode structure 30 may include the second substrate 102, the positive electrodes 140, the tuning electrodes 130, and the control electrodes 150.

The positive electrodes 140 may be arranged in island shape on the second substrate 102. The tuning electrodes 130 may be disposed on the positive electrodes 140, respectively. The tuning electrodes 130 may be aligned with the carbon nanotubes 110 of FIG. 4A when coupling them. The control electrodes 150 may be disposed around the tuning electrodes 130, respectively. The control electrodes 150 may face each other with the tuning electrode 130 in the center thereof.

The RF device according to the embodiment of the present invention achieves miniaturization, low power consumption, and high sensitivity by using an electrical signal generated according to an external RF signal and the electrical and structural characteristics of a single CNT.

The RF device according to the embodiment of the present invention achieves nanomaterial based subminiaturization and low power consumption using the electrical and structural characteristics of a single CNT. Thus, a low temperature process can be used to realize the RF device on a flexible substrate such as a plastic substrate as well as a silicon or glass substrate. Accordingly, the RF device can achieve low power consumption, subminiaturization, and integration required in industrial fields and applied to daily life.

Semiconductor processes can be used for the RF device, and the RF device achieving low power consumption and subminiaturization can be integrated on various substrates including silicon substrates, so that high-tech fusion RF technology can be easily applied to subminiaturized wireless sensors or implantable medical diagnosis and therapeutic devices to achieve low cost and mass production.

The RF device according to the present invention includes a CNT that functions as an antenna receiving a RF signal, so that subminiaturization and low power consumption of a RF receiver can be achieved in the simple manner. Standard CMOS and IC process technologies can be used for the RF device, thereby providing IT based device technologies that aim at low power, subminiaturized and portable networks. Thus, the RF device can expand the application of RFID expected to be widely used in the near future. The RF device, achieving implanted subminiaturized devices or wireless network based sensor nodes, can be applied to high-tech fusion industries and daily life.

The typical semiconductor technologies can be used for the RF device according to the present invention so as to easily achieve the integration and mass production thereof, and the low temperature process can be used to realize the RF device on a flexible substrate such as a plastic substrate as well as a silicon or glass substrate. The RF device may be combined with other next generation IT based technologies to comprehensively improve mobility, portability, and network thereof.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. A radio frequency device comprising:
   a vibratile carbon nanotube having a nanotube natural frequency;
   a negative electrode fixed to a first end of the carbon nanotube;

a vibratile tuning electrode facing a second end of the carbon nanotube; and a positive electrode electrically connected to a first end of the tuning electrode, wherein a second end of the tuning electrode is adjacent to the second end of the carbon nanotube, and the carbon nanotube vibrates at a carrier frequency according to an external electromagnetic wave having the carrier frequency, and the tuning electrode amplifies an electron emission sensitivity between the second end of the carbon nanotube and the second end of the tuning electrode under a bias between two electrodes.

2. The radio frequency device of claim 1, wherein the tuning electrode vibrates at a tuning natural frequency.

3. The radio frequency device of claim 2, further comprising a control electrode disposed around the tuning electrode, wherein the control electrode applies an electric field between the tuning electrode and the control electrode to change the tuning natural frequency.

4. The radio frequency device of claim 3, wherein the electric field may be applied in DC, AC or pulse form between the control electrode and the tuning electrode.

5. The radio frequency device of claim 3, wherein an alternating current having the tuning natural frequency is applied to the control electrode to increase an amplitude of the tuning electrode.

6. The radio frequency device of claim 2, wherein the tuning natural frequency of the tuning electrode ranges from about 50 MHz to about 500 MHz.

7. The radio frequency device of claim 1, wherein the carbon nanotube has a single-wall structure or a multi-wall structure.

8. The radio frequency device of claim 1, wherein the carbon nanotube is less than the tuning electrode in diameter.

9. The radio frequency device of claim 1, wherein the tuning electrode has a cylindrical container shape or a cylindrical rod shape.

10. The radio frequency device of claim 1, wherein the tuning electrode comprises a shell tuning electrode and an inner dielectric, and the shell tuning electrode is disposed on an outer surface of the inner dielectric.

11. The radio frequency device of claim 1, wherein a pulse or modulating bias voltage may be applied in addition to a DC bias between the negative electrode and the positive electrode.

* * * * *